(12) United States Patent
Nair et al.

(10) Patent No.: US 6,611,448 B2
(45) Date of Patent: Aug. 26, 2003

(54) FERROELECTRIC MEMORY AND METHOD FOR READING THE SAME

(75) Inventors: Rajendran Nair, Gilbert, AZ (US); David G. Chow, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/919,575

(22) Filed: Jul. 30, 2001

(65) Prior Publication Data

US 2003/0026122 A1 Feb. 6, 2003

(51) Int. Cl.[7] .............................................. G11C 11/22
(52) U.S. Cl. ........................ 365/145; 365/149; 365/207; 365/205
(58) Field of Search .............................. 365/145, 149, 365/205, 207, 208

(56) References Cited

U.S. PATENT DOCUMENTS

| | | | | |
|---|---|---|---|---|
| 5,274,583 A | * | 12/1993 | Rapp | 365/145 |
| 5,721,699 A | * | 2/1998 | DeVilbiss | 365/117 |
| 5,959,878 A | * | 9/1999 | Kamp | 365/145 |
| 5,995,408 A | * | 11/1999 | Kinney | 365/145 |
| 6,128,039 A | * | 10/2000 | Chen et al. | 348/294 |
| 6,198,654 B1 | * | 3/2001 | Ashikaga | 365/145 |
| 6,301,145 B1 | * | 10/2001 | Nishihara | 365/145 |
| 6,333,870 B1 | * | 12/2001 | Kang | 365/145 |
| 6,462,979 B2 | * | 10/2002 | Schlosser et al. | 365/158 |

* cited by examiner

*Primary Examiner*—Richard Elms
*Assistant Examiner*—Toan Le
(74) *Attorney, Agent, or Firm*—Marger Johnson & McCollom

(57) ABSTRACT

A ferroelectric memory device and method for reading such a device utilize capacitive coupling between a bit line and sense amplifier. The gain depends on a capacitance ratio rather than the absolute value of a capacitor. Ratiometric gain control reduces the gain variability of a sense amplifier, thereby allowing more accurate sensing. Attenuating the signal from an active bit line eliminates the need for high voltage devices in a sense amplifier arrangement.

29 Claims, 5 Drawing Sheets

FERROELECTRIC MEMORY AND METHOD FOR READING THE SAME

BACKGROUND OF THE INVENTION

The present invention relates generally to electronic memory and, more particularly, to a ferroelectric memory device and a method of reading such a device.

Ferroelectric memory is a type of nonvolatile memory that utilizes the ferroelectric behavior of certain materials to retain data in a memory device in the form of positive and negative polarization, even in the absence of electric power. A ferroelectric material contains domains of similarly oriented electric dipoles that retain their orientation unless disturbed by some externally imposed electric force. The polarization of the material characterizes the extent to which these domains are aligned. The polarization can be reversed by the application of an electric field of sufficient strength and polarity.

FIG. 1 illustrates a prior art ferroelectric cell 10 in a ferroelectric memory array. A ferroelectric material 16 having a polarization P is sandwiched between a conductive word line 20 and a conductive bit line 22. An electric field may be applied to the ferroelectric cell by applying an electric potential (voltage) between the word line and the bit line so as to effect changes in the polarization of the ferroelectric material.

When a positive voltage of sufficiently large magnitude is applied to the cell, all of the domains in the cell are forced to align, to the extent possible, in the positive direction. If the voltage is then reduced to zero, some of the domains switch their orientation (also referred to as rotating, flipping or reversing), but most of the domains retain their orientation. Thus, the ferroelectric material retains a remnant polarization in the positive direction.

If a negative voltage of sufficiently large magnitude is then applied to the word line relative to the bit line, all of the domains are forced to switch their orientation. Removing this negative voltage allows some of the domains to switch, but the cell polarization retains a remnant polarization in the negative direction until it is disturbed again.

For purposes of data storage, the ferroelectric cell 10 is considered to be in the logic "0" (zero) state when the polarization is positive, and the logic "1" (one) state when the polarization is negative.

A certain amount of charge is required to switch the polarity of a domain. This charge release provides the fundamental principle for a "destructive" read of a ferroelectric cell. For example, the state of a cell can be read by observing the charge released from the cell while applying a positive voltage sufficient to switch the polarization of the cell. A large charge release indicates that the cell was a logic one, whereas little or no charge release indicates that the cell was a logic zero. The cell ends up in the zero state, regardless of its state before the read operation. Thus, a cell that was in the one state must then be rewritten as a one if further data retention is required.

DETAILED DESCRIPTION

Figure 1:
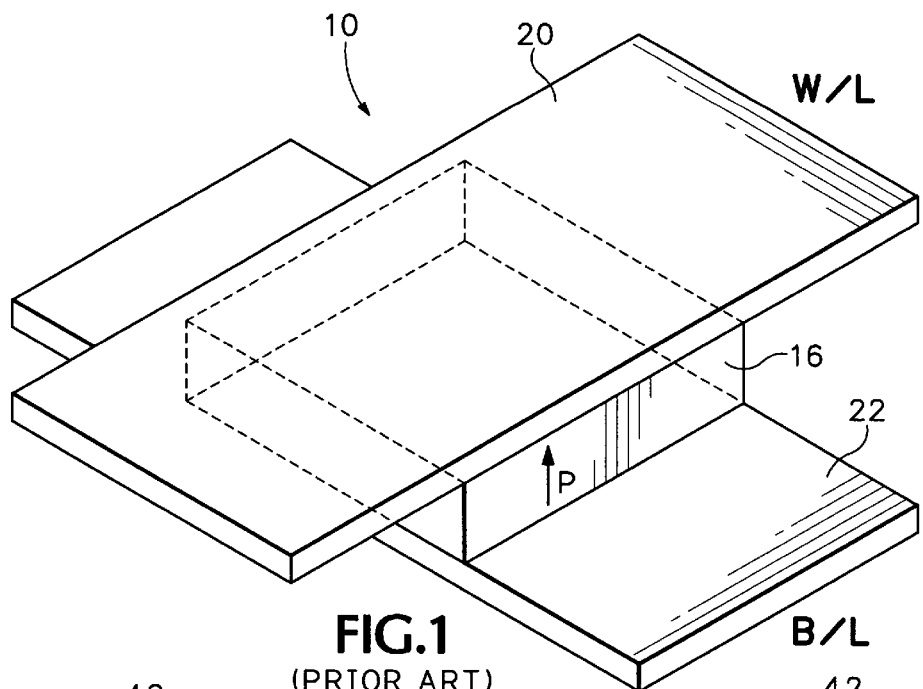
FIG. 1 illustrates a prior art ferroelectric cell in a ferroelectric memory array.
Figure 2:
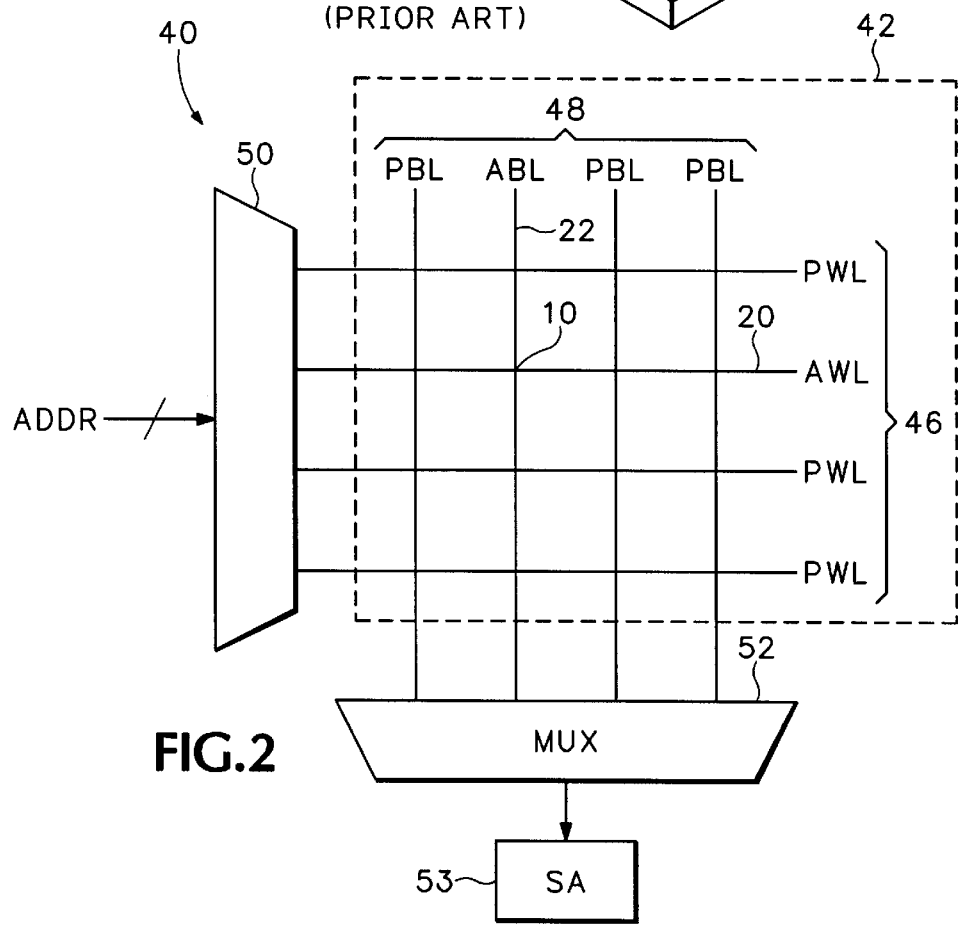
FIG. 2 is a block diagram of a ferroelectric memory device for an exemplary embodiment of the present invention.

FIG. 2 illustrates simplistically a ferroelectric memory device 40 for an exemplary embodiment of the present invention. Memory device 40 includes a cross-point passive matrix memory array 42 having word lines 46 that cross bit lines 48. Ferroelectric material is disposed between the word lines and bit lines to form ferroelectric cells at the intersections of word lines and bit lines. For example, a ferroelectric cell 10, such as that shown in FIG. 1, is located at the crossing of the word line identified as 20 and the bit line identified as 22 in FIG. 2. In this example, cell 10 is referred to as "active" because it identifies a specific cell that has been selected to read. The word line coupled to the active cell is identified as an active word line (AWL), whereas the remaining word lines are passive word lines (PWL). Likewise, the bit line coupled to the active cell is identified as the active bit line (ABL), whereas the remaining bit lines are passive bit lines (PBL).

When reading an active cell, a read or switching level voltage ($V_s$) is applied to the active word line 20. The read level voltage has a magnitude that is defined relative to the active bit line 22, and is sufficient to effect a polarization reversal of the active cell 10. Thus, the active cell is destructively read, wherein application of the read level voltage may switch the cell's polarization state. To restore the stored data after a polarization reversal, the data is written back into the active cell in a known fashion.

During the read, the passive bit lines and passive word lines are driven with voltages that provide quiescent level electric fields across the passive ferroelectric cells. Quiescent level voltages may temporarily disturb the ferroelectric cell, but are not strong enough to switch the polarization of the cell. For example, a quiescent voltage level having a magnitude no greater than ⅓ the switching level voltage will typically not be enough to reverse the cell polarization.

Referring again to FIG. 2, the word lines 46 are driven by a row decoder 50 that selects which of the word lines to drive as an active word line and which to drive as passive word lines in response to row address information. In the embodiment of FIG. 2, the bit lines are selectively coupled to a sense amplifier (also referred to as a "sense amp") 53 through multiplexer 52, but other arrangements may be used. For example, in another embodiment, each bit line could be coupled to a separate sense amplifier, thereby eliminating the multiplexer. The entire device 40 is typically fabricated on a single integrated circuit.

Figure 3:
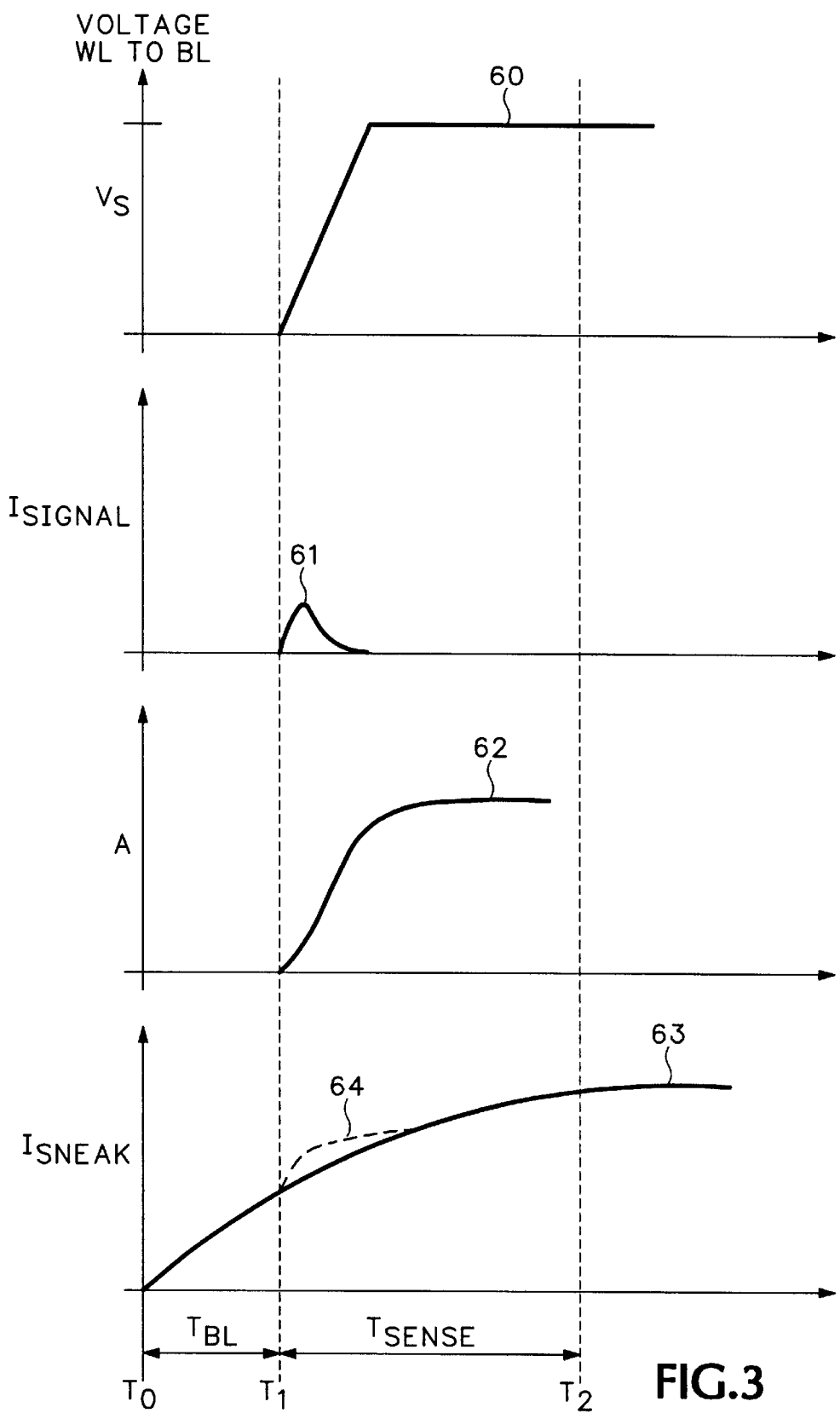
FIG. 3 is a timing diagram for illustrating sneak charge in a ferroelectric memory device.

FIG. 3 illustrates simplistically and ideally an exemplary method of reading a ferroelectric memory cell, such as cell 10 in FIG. 1, wherein charge is released and integrated during the application of a switching level voltage to the cell. After time duration TBL (e.g., a bit line settling time as will be described below), the word line is activated by applying a switching level voltage Vs to the word line 20 relative to the bit line 22, which is driven to zero volts. Through duration $T_{sense}$, the active cell, if it is in the logic "one" state (i.e., negative polarization), releases polarization reversal charge in the form of a signal current $I_{signal}$ shown as curve 61 through the bit line.

Because this signal charge is typically very small, the signal current is integrated using an integrating sense amplifier so as to extract all of the signal released from the memory element over the full duration of release. Thus, the integrating sense amplifier generates the integrated output signal A shown as curve 62. If the cell was in the logic "zero" state (i.e., positive polarization), little or no charge is released, the signal current is essentially zero, and thus, the integrated output signal A remains at zero.

Referring to FIG. 2, however, active bit line 22 is coupled not only to active cell 10, but also to other passive cells where it crosses the passive word lines. Likewise, active word line 20 is also coupled to passive cells associated with the passive bit lines. To prevent corruption of the data stored in the passive cells during a read operation, the passive word lines are driven with a passive word line biasing of Vs/3, and the passive bit lines are driven with a passive bit line biasing of 2Vs/3 at time $T_0$ in FIG. 3. Thus, none of the passive cells experiences a differential voltage greater than the quiescent voltage Vs/3 (also referred to as a disturb voltage), and, due to the resilient qualities of the ferroelectric cell, the polarization of the passive cells is not reversed.

However, although the quiescent bias of Vs/3 on the passive cells coupled to bit line 22 in FIG. 2 is not enough to reverse the cell polarization, it causes the passive cells to release "sneak charge" in the form of a sneak current sneak shown (not to scale) as curve 63 in FIG. 3. The sneak charge form a single passive cell is typically much smaller than the polarization reversal charge of an active cell. In a practical implementation, however, the active bit line is typically coupled to thousands of passive cells in addition to the one active cell. Thus, the sneak current from the passive cells on the bit line overwhelms the actual signal current (shown summed with the sneak current as dashed curve 64) from the active cell. In a practical implementation, the magnitude of the sneak current can be hundreds of times that of the signal current. Although collectively much larger than the signal current, the sneak current increases at a slower rate (typically modeled as a 50 μs time constant) than the signal current which has a much shorter rise time.

Figure 4:
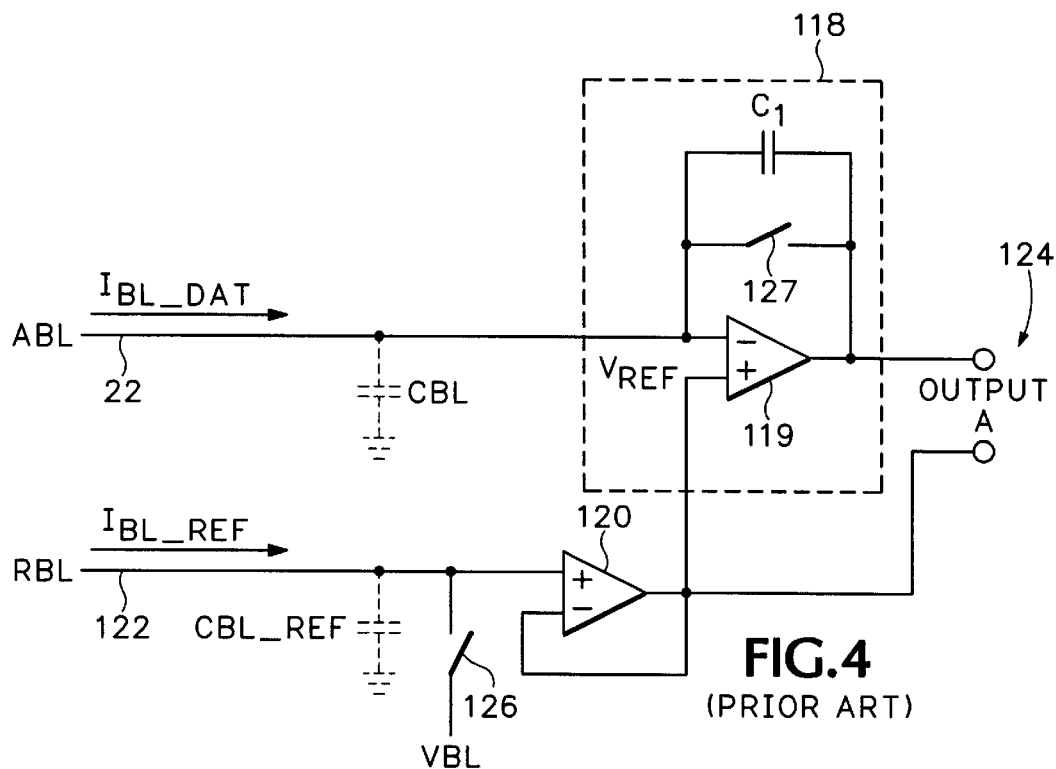
FIG. 4 is a schematic diagram of a prior art sense amplifier arrangement for reading a ferroelectric cell.

To distinguish the actual signal charge and current from the sneak charge and current, a sense amp arrangement such as that shown in FIG. 4 can be used to subtract an (ideally) equal sneak current obtained from a reference bit line RBL from the sneak current from the active bit line ABL, thereby integrating only the actual signal current. The sense amp circuit of FIG. 4 includes an integrating amplifier 118 comprised of an operational amplifier (op amp) 119 arranged as an integrator with capacitor $C_1$ and reset switch 127 in its feedback network. The inverting input of the op amp is coupled to the active bit line ABL, typically through a multiplexer (not shown), to receive the current $I_{BL\_DAT}$, which includes a signal current component and a sneak current component.

The noninverting input of the op amp is coupled to the output of a reference amplifier 120 which is arranged as a voltage follower and coupled to a reference bit line RBL to receive the current $I_{BL\_REF}$ which is ideally a replica of the sneak current released by the active bit line. The active and reference bit lines have parasitic capacitances shown as $C_{BL}$ and $C_{BL\_REF}$, respectively. A switch 126 is coupled between the reference bit line and a precharge power supply $V_{BL}$.

The operation of the sense amp circuit of FIG. 4 will now be described with reference to FIGS. 2, 3 and 4. Prior to time $T_0$, reset switch 127 is closed to prevent capacitor $C_1$ from charging, and the word lines and bit lines are all biased at the voltage level Vs/3. At time To, the voltage level of the passive bit lines is increased to $2V_s/3$, and switch 126 is closed to precharge the reference bit line to VBL (in this case, 0 volts). This also maintains the active bit line at VBL due to the virtual short circuit between the noninverting (+) and inverting (−) terminals of the amplifier 118. Alternatively, the active bit line may be held at VBL through other techniques, as would be necessary for example, if the circuit of FIG. 4 did not include the reference bit line.

At these levels, the ferroelectric cells between the word lines and active bit line experience a voltage potential of $V_s/3$. This causes any passive cells in the "one" state along the active bit line to release a residual amount of sneak charge to provide a sneak current (curve 63 in FIG. 3) to the active bit line. Bit line settling duration $T_{BL}$ between times $T_0$ and $T_1$ allows the sneak current to stabilize before trying to determine the state of the active cell.

At time $T_1$, switch 126 is opened, and the active word line is driven with the active word line biasing $V_s$ as depicted by waveform 60 at time $T_1$. Since the active bit line remains at the active bit line biasing of 0 volts, the active ferroelectric cell located at the intersection of the active word line and active bit line receives the full read voltage potential sufficient for switching its polarization state. If the active cell is in the "one" state, a substantial signal charge (curve 61 in FIG. 3) is release to the active bit line. Alternatively, if the active cell is in the "zero" state, only a nominal amount of charge would propagate to the active bit line.

Also at time $T_1$, switch 127 is opened to allow the sense amplifier to begin integrating the current $I_{BL\_DAT}$ from the active bit line. Because the sense amplifier is connected directly to the active bit line, the full charge released from the active memory cell (as well as any remnant sneak charge after subtracting the signal from the reference bit line) is allowed to accumulate in the feedback capacitor $C_1$. If Qs is the charge released during the access operation on the active bit line (which has an associated parasitic capacitance CBL), all of this charge minus any leakage current in the parasitic devices is collected in capacitor $C_1$ giving rise to an output voltage variation $V_{SIGNAL}$ given by:

$$V_{SIGNAL} = \frac{Q_S}{C_1}$$

The output signal from the sense amp of FIG. 4 is therefore directly proportional to the released charge $Q_S$ and inversely proportional to the capacitance of $C_1$.

A primary disadvantage of the circuit of FIG. 4 is that the output signal from the sense amplifier is dependent upon the absolute value of the capacitance of $C_1$. The absolute value of $C_1$, however, is difficult to control accurately due to variations in the manufacturing process. This variation adds to the other sources of variation of the raw signal from the memory cell such as fatigue in the ferroelectric material. Thus, the manufacturing variation in the absolute value of the capacitance of $C_1$ creates a gain variability in the circuit.

This problem is compounded by the very small magnitude of the signal charge obtained from an active cell because, to increase the gain of the sense amp so as to enable it to sense smaller currents, the absolute value of $C_1$ must be reduced. However, this causes even greater gain variability, since smaller dimensions lead to greater variations in the absolute value of $C_1$.

Figure 5:
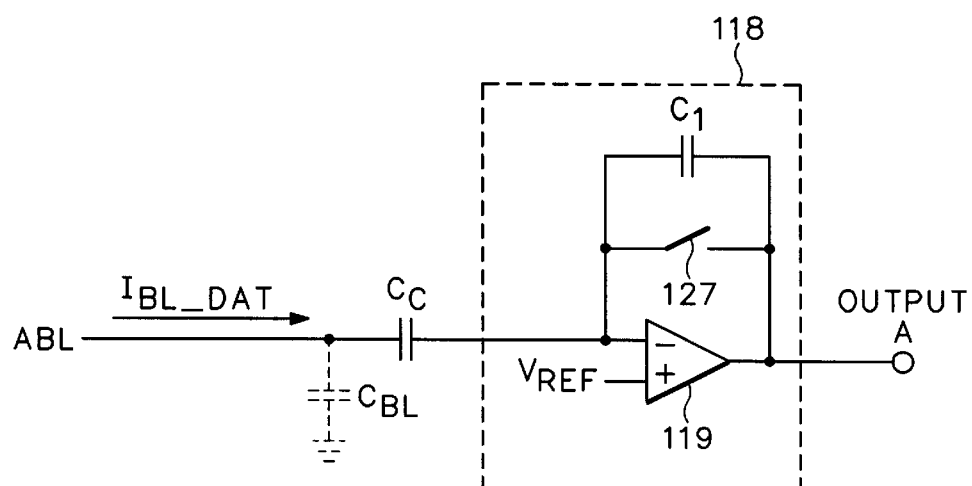
FIG. 5 is a schematic diagram of an embodiment of a sense amplifier arrangement for a ferroelectric memory device in accordance with the present invention.

One aspect of the present invention involves the use of capacitive coupling to reduce the gain variability of a sense amp. FIG. 5 is a schematic diagram of an embodiment of a sense amplifier arrangement for a ferroelectric memory device in accordance with the present invention. The arrangement of FIG. 5 includes an integrating amplifier 118 based on an operational amplifier 119 having a feedback capacitor $C_1$ and reset switch 127 connected between its output and inverting (−) input. The noninverting (+) input of the op amp is coupled to receive a reference signal VREF which maintains the (−) input at a virtual ground. Rather than connecting the active bit line ABL directly to the (−) input of the op amp, however, it is coupled to the op amp through a coupling capacitor $C_C$.

The output signal $V_{SIGNAL}$ is therefore given by the following:

$$V_{SIGNAL} = \left(\frac{C_C}{C_1}\right)\left(\frac{Q_S}{C_C + C_{BL}}\right) \quad \text{(Eq. 2)}$$

where $C_{BL}$ is the parasitic capacitance of the active bit line. From Eq. 2 it is apparent that the gain depends on the capacitance ratio $C_C/C_1$ rather than the absolute value of a capacitor. This reduces the gain variability of the circuit because, although it is difficult to control the absolute value of a capacitor during the manufacturing process, the ratio of two capacitors can be controlled very accurately.

This advantage can be better understood by considering the following examples. First, substituting values of 100 units for $C_{BL}$ and 25 units for $C_1$ into Eq. 1 for the prior art circuit of FIG. 4, the value of the output signal $V_{SIGNAL}$ is given by:

$$V_{SIGNAL} = \frac{Q_S}{25} \quad \text{(Eq. 3)}$$

But a ±20 percent variation in the absolute value of $C_1$ yields a similarly large variation of ±20 percent in the output signal.

Substituting values of 100 units for $C_{BL}$, 5 units for $C_1$, and 25 units for $C_C$ into Eq. 2 for the embodiment of the present invention shown in FIG. 5 yields the following result:

$$V_{SIGNAL} = \left(\frac{25}{5}\right)\left(\frac{Q_S}{25 + 100}\right) = \frac{Q_S}{25} \quad \text{(Eq. 4)}$$

So, the gain is still the same as in Eq. 3. However, since capacitors $C_1$ and $C_C$ can be laid out as well-matched devices, a ±20 percent variation in the absolute value of $C_1$ is accompanied by a corresponding ±20 percent variation in the absolute value of $C_C$. For example, if $C_1$ and $C_C$ are both reduced by 20 percent (i.e., $C_1$=4 units and $C_C$=20 units), then Eq. 2 yields:

$$V_{SIGNAL} = \left(\frac{20}{4}\right)\left(\frac{Q_S}{20 + 100}\right) = \frac{Q_S}{24} \quad \text{(Eq. 5)}$$

That is, a 20 percent variation in $C_1$ and $C_C$ only causes a 4 percent variation in $V_{SIGNAL}$ because $C_1$ and $C_C$ vary in the same proportion. Thus, the use of capacitance ratios in accordance with the present invention reduces the gain variability in the sensing operation.

An additional advantage of the present invention can be understood by rearranging Eq. 2 as follows:

$$V_{SIGNAL} = \left(\frac{Q_S}{C_1}\right)\left(\frac{C_C}{C_C + C_{BL}}\right) \quad \text{(Eq. 6)}$$

The original output $Q_S/C_1$ is attenuated by the factor $C_C/(C_C+C_{BL})$, so any noise or offsets caused by the sneak currents are also attenuated by the same factor, thus keeping the signal to sneak ratio the same as in the prior art, while still reducing the gain variability.

It is also apparent from Eq. 6 that the bit line parasitic capacitance $C_{BL}$ is a factor in determining the gain of the sense amp. The attenuation discussed above can be minimized by making $C_C$ large with respect to $C_{BL}$, but since the bit line capacitance also plays a part in minimizing the gain variation, it is actually preferable to keep the coupling capacitance $C_C$ small relative to $C_{BL}$. This can be better understood by changing $C_{BL}$ from 100 units to 25 units in Eq. 4 to yield the following result:

$$V_{SIGNAL} = \left(\frac{25}{5}\right)\left(\frac{Q_S}{25 + 25}\right) = \frac{Q_S}{10} \quad \text{(Eq. 7)}$$

Now, if $C_1$ and $C_C$ are both reduced by 20 percent (i.e., $C_1$=4 units and $C_C$=20 units), then Eq. 7 yields $V_{SIGNAL}$=QS/9, or a 10 percent variation in gain. Although this is still much better than the 20 percent change provided by the prior art in Eq. 3, it is apparent that the value of $C_C$ is preferably, though not necessarily, kept small relative to $C_{BL}$.

Figure 5A:
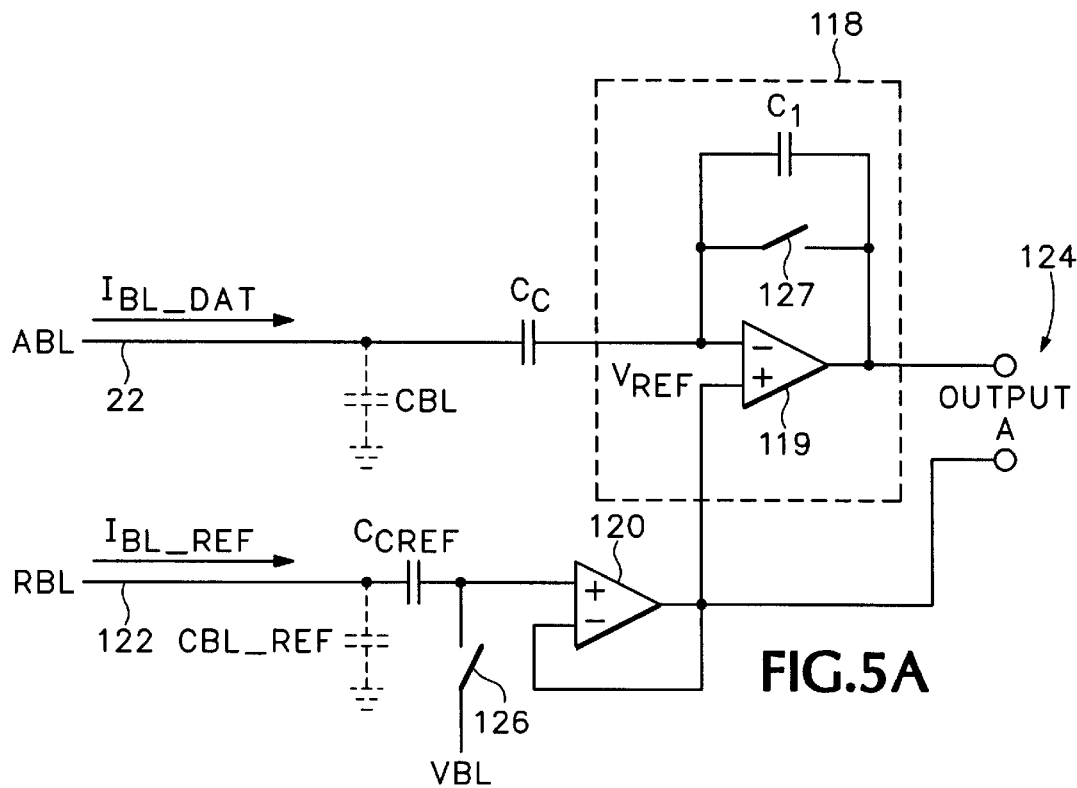
FIG. 5A is a schematic diagram of another embodiment of a sense amplifier arrangement for a ferroelectric memory device in accordance with the present invention.
Figure 7:
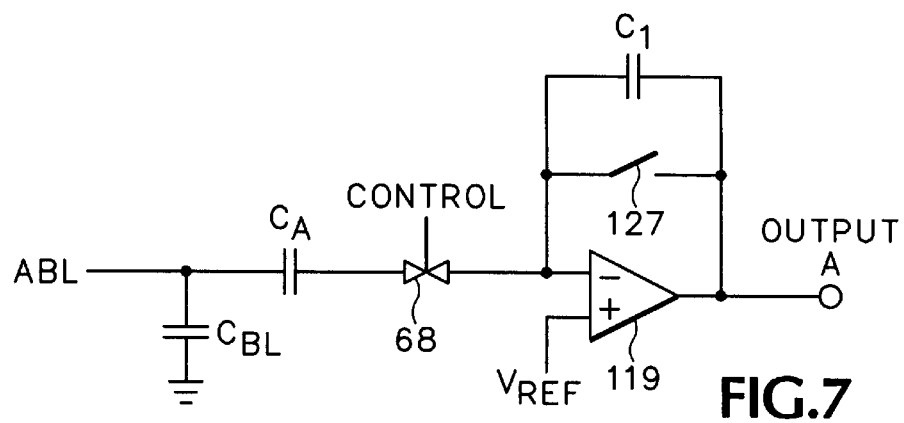
FIG. 7 is a schematic diagram of an another embodiment of a sense amplifier arrangement for a ferroelectric memory device in accordance with the present invention.
Figure 7A:
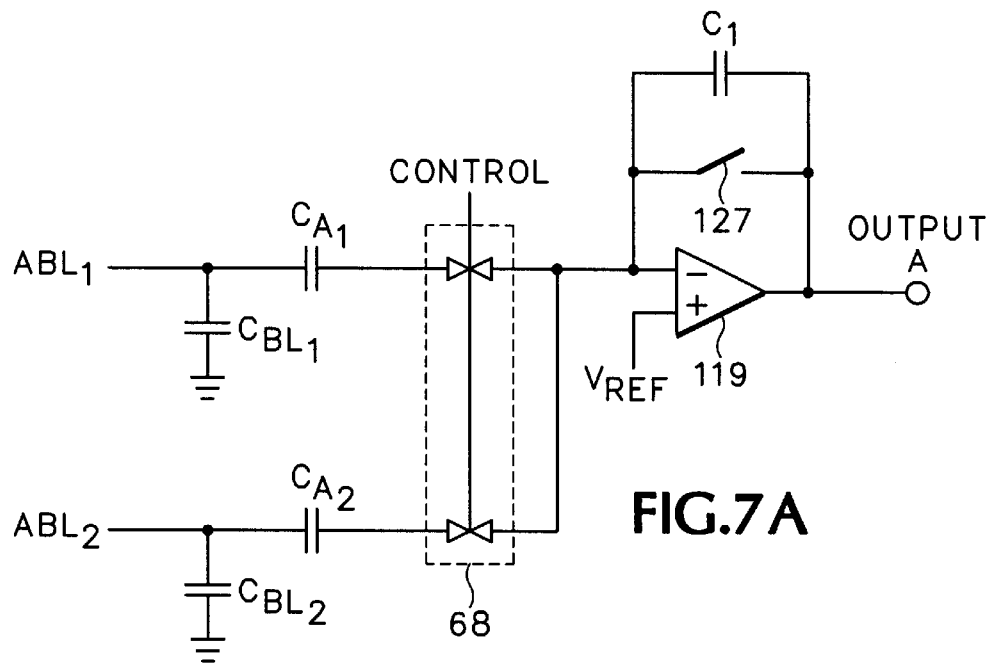
FIG. 7A is a schematic diagram of another embodiment of a sense amplifier arrangement for a ferroelectric memory device in accordance with the present invention.

If the embodiment of the present invention shown in FIG. 5 is used with a reference bit line RBL as shown in FIG. 4, then the reference bit line would preferably be capacitively coupled to the reference amplifier 120 as well as shown in FIG. 5A. In the embodiment shown in FIG. 5, a multiplexer may also be coupled between the coupling capacitor $C_C$ and the sense amplifier, with additional bit lines coupled to the sense amp through the multiplexer and additional coupling capacitors as shown in FIG. 7A.

Yet another advantage of the use of capacitive coupling in accordance with the present invention is that it provides better sneak current cancellation, and therefore, allows the use of higher gain in the sense amp. This is because, in a practical embodiment utilizing sneak current cancellation, the subtraction (reference) portion of the circuit would typically not be designed to cancel 100 percent of the sneak current because device tolerances might actually result in a negative active signal current being integrated. Instead, the sense amp arrangement is typically designed to cancel about 80 or 90 percent of the sneak current. With the improved gain accuracy of the present invention, however, the percentage of sneak current cancellation, and thus the overall gain and sensitivity of the sense amp, can be increased. Thus, another aspect of the present invention is the use of ratiometric gain control to reduce gain variability.

Figure 6:
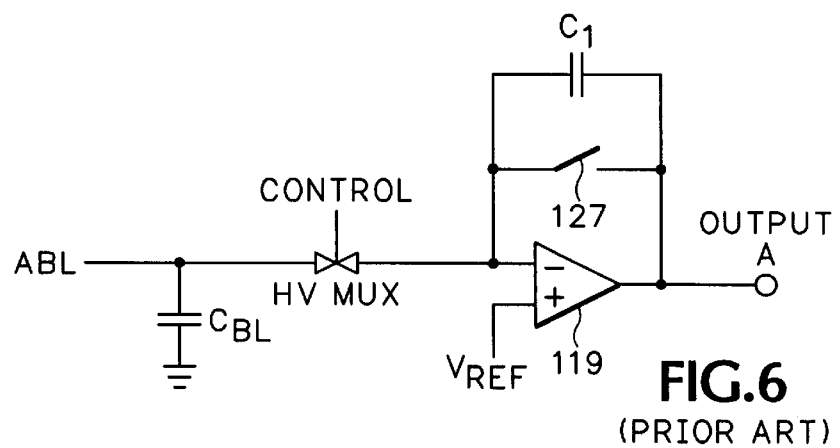
FIG. 6 is a schematic diagram of a prior art sense amplifier arrangement having a multiplexer for reading a ferroelectric cell.

Another aspect of the present invention involves attenuating the signal from the active bit line to eliminate the need for high voltage devices. FIG. 6 illustrates a prior art arrangement in which a bit line is connected to a sense amplifier through a multiplexer. Since the read voltages applied to the word lines and bit lines in a ferroelectric memory device are typically as high as 20 volts, the multiplexer must be a high voltage device that requires additional area on an integrated circuit, and additional control signals that operate in the high voltage domain. The multiplexer may also contribute to degrading the raw signal from the bit line through process and temperature dependent leakage currents.

To overcome such problems, an embodiment of a ferroelectric memory device in accordance with another aspect of the present invention includes an attenuator coupled between a bit line and sense amplifier. The inherent parasitic capacitance of a bit line for a ferroelectric memory device makes it convenient to implement such an attenuator because the parasitic capacitance forms part of the attenuator. By coupling an attenuation capacitor $C_A$ between the bit line and sense amplifier as shown in FIG. 7, the capacitances $C_A$ and $C_{BL}$ split the current from the bit line and isolate the bit lines of the memory array from the low voltage electronic sense circuitry. This configuration assures that the voltages seen at the nodes of the sense circuitry are within the tolerance limits of its component devices. If a multiplexer 68 is used as shown in FIG. 7, it can be constructed from lower voltage components.

Having described and illustrated the principles of the invention in a preferred embodiment thereof, it should be apparent that the invention can be modified in arrangement and detail without departing from such principles. Accordingly, such changes and modifications are considered to fall within the scope of the following claims.

What is claimed is:

1. A memory device comprising:
   a bit line coupled to a transistorless ferroelectric memory cell;
   a sense amplifier; and
   a capacitor coupled between the bit line and the sense amplifier, wherein the capacitor is arranged so that the value of the capacitor affects the output of the sense amplifier.

2. A memory device according to claim 1 wherein:
   the capacitor is a first capacitor; and
   the sense amplifier comprises a second capacitor.

3. A memory device according to claim 1 wherein the sense amplifier comprises an integrating amplifier.

4. A memory device comprising:
   a bit line coupled to a ferroelectric memory cell;
   a sense amplifier; and
   a capacitor coupled between the bit line and the sense amplifier;
   wherein:
      the capacitor is a first capacitor;
      the sense amplifier comprises a second capacitor;
      the sense amplifier has a gain; and
      the first and second capacitors are arranged such that the gain of the sense amplifier depends on the capacitance ratio of the first and second capacitors.

5. A memory device comprising:
   a bit line coupled to a ferroelectric memory cell;
   a sense amplifier; and
   a capacitor coupled between the bit line and the sense amplifier;
   wherein:
      the sense amplifier comprises an integrating amplifier;
      the capacitor is a first capacitor; and
      the integrating amplifier comprises:
         an operational amplifier having a first input coupled to the first capacitor; and
         a second capacitor coupled between the first input and an output of the operational amplifier.

6. A memory device comprising:
   a bit line coupled to a ferroelectric memory cell;
   a sense amplifier;
   a capacitor coupled between the bit line and the sense amplifier;
   a reference bit line coupled to a second ferroelectric memory cell; and
   a second capacitor coupled between the reference bit line and the sense amplifier.

7. A memory device comprising:
   a bit line coupled to a ferroelectric memory cell;
   a sense amplifier;
   a capacitor coupled between the bit line and the sense amplifier; and
   a multiplexer coupled between the capacitor and the sense amplifier.

8. A memory device comprising:
   a bit line coupled to a ferroelectric memory cell;
   a sense amplifier; and
   an attenuator coupled between the bit line and the sense amplifier, wherein the attenuator is arranged to reduce the voltage at an input of the sense amplifier.

9. A memory device according to claim 8 wherein the attenuator comprises a capacitor coupled between the bit line and the sense amplifier.

10. A memory device according to claim 9 wherein:
    the bit line has a parasitic capacitance; and
    the capacitor is arranged to split current with the parasitic capacitance.

11. A memory device according to claim 8 wherein the attenuator comprises a capacitor coupled between the bit line and a virtual ground.

12. A memory device comprising:
    a bit line coupled to a ferroelectric memory cell;
    a sense amplifier;
    an attenuator coupled between the bit line and the sense amplifier; and
    a multiplexer coupled between the attenuator and the sense amplifier.

13. A memory device according to claim 12 further comprising:
    a second bit line coupled to a second ferroelectric memory cell; and
    a second attenuator coupled between the second bit line and the multiplexer.

14. A memory device comprising:
    a bit line coupled to a ferroelectric memory cell;
    means for amplifying a signal from the bit line; and
    means for providing ratiometric control of the means for amplifying.

15. A memory device according to claim 14 wherein the means for providing ratiometric control comprises:
    a first capacitor coupled between the bit line and the means for amplifying; and
    a second capacitor coupled between an input and an output of an amplifier.

16. A memory device according to claim 14 further comprising means for selectively coupling the bit line to the means for amplifying.

17. A memory device comprising:
   a bit line coupled to a transistorless ferroelectric memory cell;
   means for amplifying a signal from the bit line; and
   means for attenuating a signal from the bit line.

18. A memory device according to claim 17 wherein the means for attenuating comprises a capacitor coupled between the bit line and the means for amplifying.

19. A memory device according to claim 17 further comprising means for selectively coupling the bit line to the means for amplifying.

20. A sense amplifier for a ferroelectric memory device comprising:
   an operational amplifier;
   a first capacitor having a first terminal arranged to receive a signal from a bit line coupled to a ferroelectric memory cell and a second terminal coupled to an input of the operational amplifier; and
   a second capacitor coupled between the input and an output of the operational amplifier.

21. A sense amplifier according to claim 20 further comprising a switch coupled in parallel with the second capacitor.

22. A sense amplifier for a ferroelectric memory device comprising:
   an operational amplifier;
   a first capacitor having a first terminal arranged to receive a signal from a bit line and a second terminal coupled to an input of the operational amplifier;
   a second capacitor coupled between the input and an output of the operational amplifier; and
   a multiplexer coupled between the second capacitor and the input of the operational amplifier.

23. A sense amplifier according to claim 22 further comprising a third capacitor having a first terminal arranged to receive a signal from a second bit line and a second terminal coupled to the multiplexer.

24. A method for sensing a transistorless ferroelectric cell coupled to a bit line comprising: coupling the bit line to a sense amplifier through a capacitor such that the value of the capacitor affects the output of the sense amplifier.

25. A method according to claim 24 further comprising integrating current received from the bit line through the capacitor.

26. A method according to claim 25 wherein integrating current comprises accumulating charge in a second capacitor.

27. A method according to claim 26 wherein:
   the first and second capacitors are coupled at a node; and
   the method further comprises maintaining the node at a virtual ground.

28. A method according to claim 26 wherein the sense amplifier has an output signal that is ratiometric with respect to the first and second capacitors.

29. A memory device comprising:
   a bit line coupled to a transistorless ferroelectric memory cell;
   a sense amplifier having a feedback network; and
   a capacitor coupled between the bit line and the sense amplifier such that the capacitor is not part of the feedback network.

* * * * *